(12) United States Patent
Shelnutt et al.

(10) Patent No.: US 10,172,262 B2
(45) Date of Patent: *Jan. 1, 2019

(54) INTEGRATED AIR-SPRING FOR HYDRAULIC FORCE DAMPING OF A RIGID LIQUID COOLING SUBSYSTEM

(71) Applicant: DELL PRODUCTS, L.P., Round Rock, TX (US)

(72) Inventors: Austin Michael Shelnutt, Leander, TX (US); Travis C. North, Cedar Park, TX (US); Christopher M. Helberg, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/698,642

(22) Filed: Sep. 8, 2017

(65) Prior Publication Data

US 2017/0374767 A1    Dec. 28, 2017

Related U.S. Application Data

(63) Continuation of application No. 15/017,582, filed on Feb. 5, 2016, now Pat. No. 9,795,065.

(Continued)

(51) Int. Cl.
*H05K 7/20* (2006.01)

(52) U.S. Cl.
CPC .............................. *H05K 7/20781* (2013.01)

(58) Field of Classification Search
CPC ....... H05K 7/20781; H05K 7/20554–7/20563; H05K 7/20718
See application file for complete search history.

(56) References Cited

U.S. PATENT DOCUMENTS 5,758,607 A    6/1998 Brendel et al.
6,462,949 B1   10/2002 Parish et al.
(Continued)

OTHER PUBLICATIONS

Dravininkas, Adam, Ex Parte Quayle Action, U.S. Appl. No. 15/016,249, The United States Patent and Trademark Office, dated Oct. 24, 2017.
(Continued)

*Primary Examiner* — David M Sinclair
*Assistant Examiner* — Robert D Brown
(74) *Attorney, Agent, or Firm* — Isidore PLLC

(57) ABSTRACT

A direct-interface liquid-cooled (DL) Rack Information Handling System (RIHS) includes liquid cooled (LC) nodes that include a system of conduits supplying cooling liquid through the node enclosure and including a supply conduit extending from a node inlet coupling and a return conduit terminating in a node outlet coupling. The node inlet port and the node outlet port are positioned in an outward facing direction at a rear of the node enclosure and aligned to releasably seal to the respective inlet liquid port and outlet liquid port in the node-receiving slot for fluid transfer through the system of conduits. An air-spring reducer conduit is in fluid communication with the system of conduits and shaped to trap an amount of compressible fluid that compresses during sealing engagement between the node inlet coupling and node outlet coupling and the inlet liquid port and outlet liquid port, respectively.

20 Claims, 12 Drawing Sheets

Related U.S. Application Data

(60) Provisional application No. 62/270,563, filed on Dec. 21, 2015, provisional application No. 62/270,580, filed on Dec. 21, 2015.

(56) References Cited

U.S. PATENT DOCUMENTS

| | | |
|---|---|---|
| 6,574,104 B2 | 6/2003 | Patel et al. |
| 6,775,137 B2 | 8/2004 | Chu et al. |
| 7,013,955 B2 | 3/2006 | Phillips et al. |
| 7,106,590 B2 | 9/2006 | Chu et al. |
| 7,403,384 B2 | 7/2008 | Pflueger |
| 7,657,347 B2 | 2/2010 | Campbell et al. |
| 7,944,694 B2 | 5/2011 | Campbell et al. |
| 7,963,119 B2 | 6/2011 | Campbell et al. |
| 7,990,709 B2 | 8/2011 | Campbell et al. |
| 8,387,249 B2 | 3/2013 | Campbell et al. |
| 8,405,975 B2 | 3/2013 | Heiberg et al. |
| 8,422,218 B2 | 4/2013 | Fried et al. |
| 8,516,284 B2 | 8/2013 | Chan et al. |
| 8,564,951 B1 | 10/2013 | Watanabe et al. |
| 8,583,290 B2 | 11/2013 | Campbell et al. |
| 8,749,968 B1 | 6/2014 | Branton |
| 8,797,740 B2 | 8/2014 | Campbell et al. |
| 8,824,143 B2 | 9/2014 | Campbell et al. |
| 8,842,433 B2 | 9/2014 | Koblenz et al. |
| 8,934,244 B2 | 1/2015 | Shelnutt et al. |
| 8,978,401 B2 | 3/2015 | Chainer et al. |
| 9,045,995 B2 | 6/2015 | Graybill et al. |
| 9,069,532 B2 | 6/2015 | Campbell et al. |
| 9,250,636 B2 | 2/2016 | Chainer et al. |
| 9,386,727 B2 | 7/2016 | Barringer et al. |
| 9,451,726 B2 | 9/2016 | Regimbal et al. |
| 9,496,200 B2 | 11/2016 | Lyon et al. |
| 10,010,013 B2 | 6/2018 | Shelnutt et al. |
| 2004/0190247 A1 | 9/2004 | Chu et al. |
| 2004/0221604 A1 | 11/2004 | Ota et al. |
| 2005/0122685 A1 | 6/2005 | Chu et al. |
| 2005/0248922 A1 | 11/2005 | Chu et al. |
| 2008/0067805 A1* | 3/2008 | Kamada .............. F02M 37/0041 285/45 |
| 2008/0232064 A1 | 9/2008 | Sato et al. |
| 2008/0276639 A1 | 11/2008 | Stoddard |
| 2009/0086428 A1 | 4/2009 | Campbell et al. |
| 2009/0086432 A1 | 4/2009 | Campbell et al. |
| 2009/0126909 A1 | 5/2009 | Ellsworth et al. |
| 2009/0126910 A1 | 5/2009 | Campbell et al. |
| 2009/0154096 A1 | 6/2009 | Iyengar et al. |
| 2009/0165868 A1 | 7/2009 | Pearson |
| 2009/0259343 A1 | 10/2009 | Rasmussen et al. |
| 2009/0262501 A1 | 10/2009 | Claassen et al. |
| 2010/0032142 A1 | 2/2010 | Copeland et al. |
| 2010/0103614 A1 | 4/2010 | Campbell et al. |
| 2010/0103618 A1* | 4/2010 | Campbell .......... H05K 7/20236 361/699 |
| 2011/0060470 A1 | 3/2011 | Campbell et al. |
| 2011/0075373 A1 | 3/2011 | Campbell et al. |
| 2011/0083621 A1 | 4/2011 | Ogunleye et al. |
| 2011/0112694 A1 | 5/2011 | Bash et al. |
| 2011/0313576 A1 | 12/2011 | Nicewonger |
| 2012/0180979 A1 | 7/2012 | Harrington |
| 2013/0098085 A1 | 4/2013 | Judge et al. |
| 2013/0106265 A1* | 5/2013 | Shelnutt ............. H05K 7/20254 312/236 |
| 2013/0112378 A1* | 5/2013 | Shelnutt ............. H05K 7/20781 165/121 |
| 2013/0128455 A1 | 5/2013 | Koblenz et al. |
| 2013/0229769 A1 | 9/2013 | Yang |
| 2013/0264046 A1 | 10/2013 | Chainer et al. |
| 2013/0312839 A1* | 11/2013 | Shelnutt .................... G06F 1/20 137/15.01 |
| 2013/0312846 A1 | 11/2013 | Eriksen et al. |
| 2013/0312854 A1 | 11/2013 | Eriksen et al. |
| 2014/0202678 A1 | 7/2014 | Goth et al. |
| 2014/0203550 A1 | 7/2014 | Utsch |
| 2014/0218859 A1* | 8/2014 | Shelnutt .................. G06F 1/206 361/679.46 |
| 2014/0321056 A1 | 10/2014 | Yoshikawa et al. |
| 2014/0328562 A1 | 11/2014 | Pitwon |
| 2015/0109735 A1 | 4/2015 | Campbell et al. |
| 2015/0233597 A1 | 8/2015 | Dempster et al. |
| 2015/0334878 A1 | 11/2015 | Long et al. |
| 2016/0066480 A1* | 3/2016 | Eckberg ............. H05K 7/20772 361/679.53 |
| 2016/0242319 A1 | 8/2016 | Edwards et al. |
| 2016/0242326 A1 | 8/2016 | Edwards et al. |
| 2016/0366792 A1 | 12/2016 | Smith et al. |
| 2017/0049009 A1* | 2/2017 | Steinke ............... H05K 7/20781 |
| 2017/0181322 A1* | 6/2017 | Shelnutt ............. H05K 7/20663 |
| 2017/0181323 A1 | 6/2017 | Shelnutt et al. |

OTHER PUBLICATIONS

Dravininkas, Adam, Non-Final Office Action, U.S. Appl. No. 15/049,074, The United States Patent and Trademark Office, dated Nov. 14, 2017.

Suryawanshi, Suresh, Non-Final Office Action, U.S. Appl. No. 15/017,604, The United States Patent and Trademark Office, dated Dec. 22, 2017.

Suryawanshi, Suresh, Non-Final Office Action, U.S. Appl. No. 15/017,451, The United States Patent and Trademark Office, dated Dec. 14, 2017.

Suryawanshi, Suresh, Non-Final Office Action, U.S. Appl. No. 15/017,492, The United States Patent and Trademark Office, dated Nov. 3, 2017.

Brown, Michael J., Non-Final Office Action, U.S. Appl. No. 15/016,234, The United States Patent and Trademark Office, dated Mar. 30, 2018.

Dravininkas, Adam B., Notice of Allowance, U.S. Appl. No. 15/016,249, The United States Patent and Trademark Office, dated Feb. 26, 2018.

Dravinikas, Adam, Final Office Action, U.S. Appl. No. 15/049,070, The United States Patent and Trademark Office, dated Apr. 27, 2018.

Patent Cooperation Treaty (PCT), International Preliminary Report on Patentability, International Application No. PCT/US2016/031379, dated Jun. 26, 2018.

Suryawanshi, Suresh, Notice of Allowance, U.S. Appl. No. 15/017,604, The United States Patent and Trademark Office, dated Jun. 6, 2018.

Suryawanshi, Suresh, Notice of Allowance, U.S. Appl. No. 15/017,492, The United States Patent and Trademark Office, dated May 2, 2018.

* cited by examiner

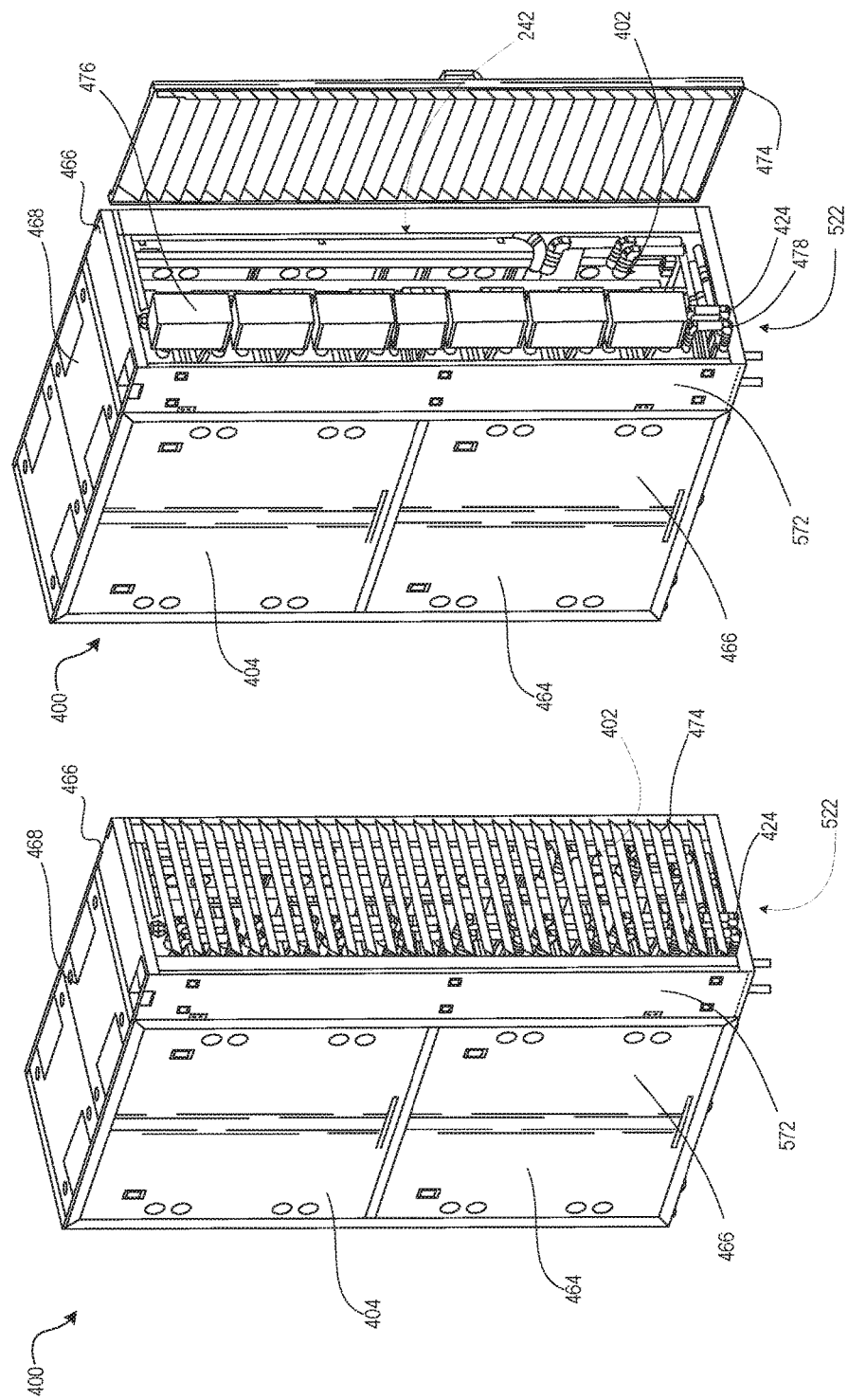

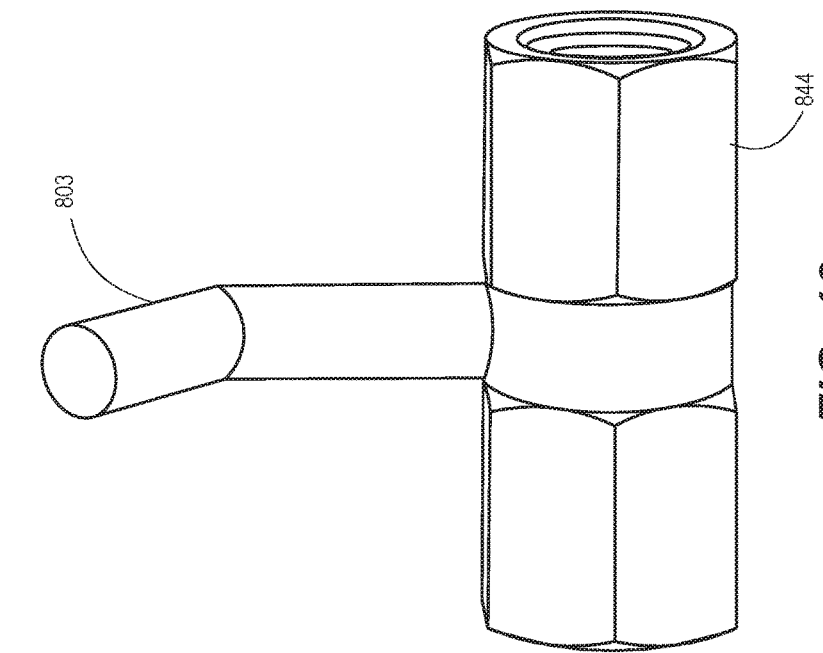
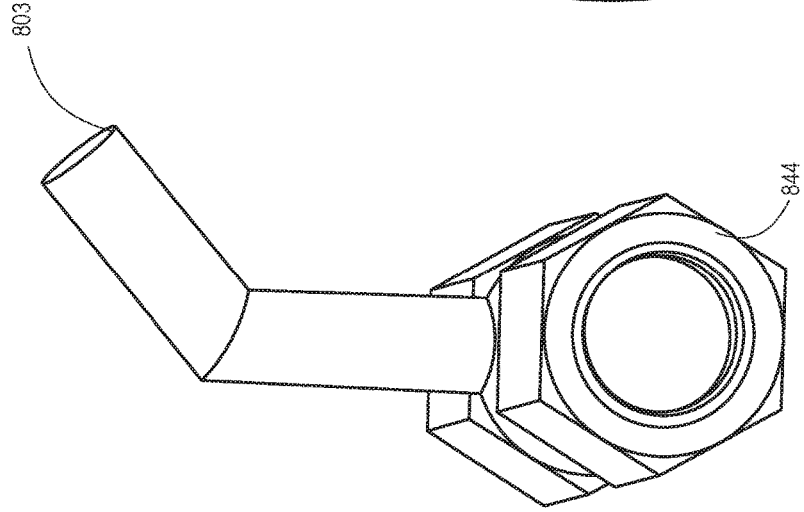

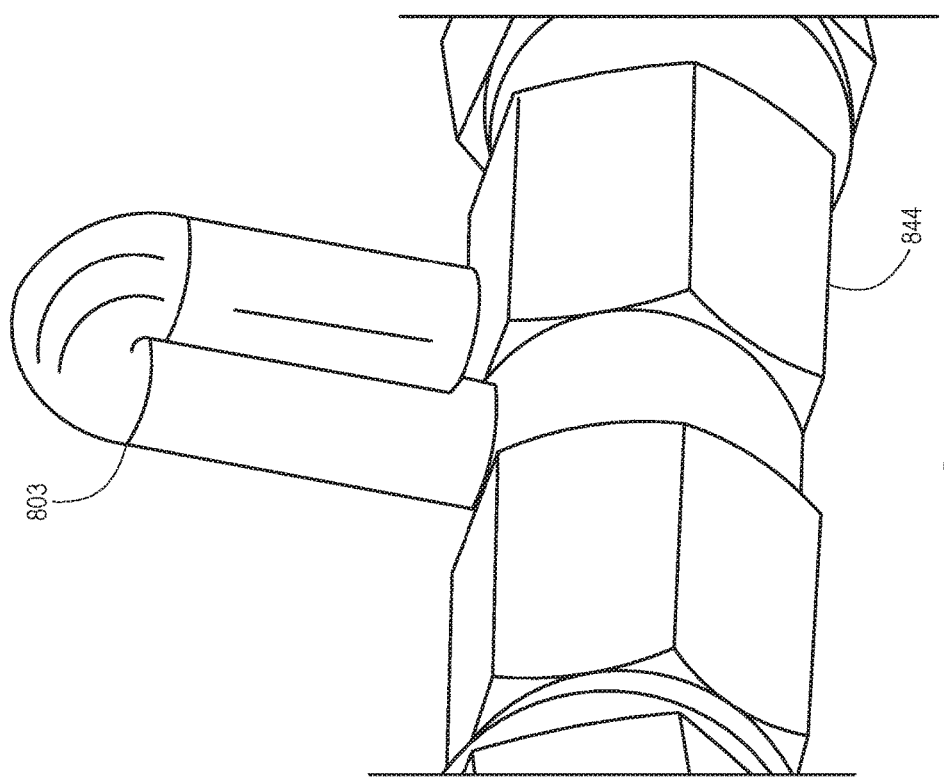

INTEGRATED AIR-SPRING FOR HYDRAULIC FORCE DAMPING OF A RIGID LIQUID COOLING SUBSYSTEM

RELATED APPLICATIONS

The present invention is a continuation of U.S. application Ser. No. 15/017,582 filed Feb. 5, 2016 which claims priority from each of the following provisional patent applications: Provisional Application Ser. No. 62/270,563, filed Dec. 21, 2015; and Provisional Application Ser. No. 62/270,580, filed Dec. 21, 2015. The contents of the above-listed applications are incorporated herein by reference.

BACKGROUND

1. Technical Field

The present disclosure generally relates to information handling systems (IHS), and more particular to a direct-interface liquid cooled (DL) rack-configured IHS (RIHS), having a liquid cooling subsystem and liquid-cooled nodes. Still more particularly, the disclosure is related to insertion of nodes into the RIHS.

2. Description of the Related Art

As the value and use of information continue to increase, individuals and businesses seek additional ways to process and store information. One option available to users is Information Handling Systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node and requiring more directed cooling solutions. Thus, there is a continuing need for further innovations to provide directed cooling for the individual heat generating components, both at the individual node level, as well as at the larger rack level. When designing the cooling subsystem, consideration must also be given to the different form factors of IT nodes and rack heights of the RIHS, and the ability to effectively control cooling discretely (at device or node level) and generally across the overall RIHS.

As liquid cooling improves in efficiencies and performance, data center solutions continue to focus on implementing liquid cooling at the rack level. Recently, localized liquid solutions (CPU/GPU cold plates) have been successful in removing most of the heat from these components within a server and into the facility cooling loop through direct fluid-to-fluid heat exchangers (server cooling loop to facility cooling loop) within the rack, but this method does not provide cooling to auxiliary components (such as storage devices (HDDs, memory), or critical secondary IT equipment, such as top of the rack switch, network switches, battery backup units, or Power Supply Units (PSUs).

To increase system availability, RIHS maintenance and upgrades can include hot plugging nodes into a block chassis with other nodes continuing to operate. In a liquid cooled RIHS, insertion of the node entails more than mechanical engagement and electrical quick connects. The newly inserted liquid cooled node can require hookup to a supply and return of cooling liquid. Supply pressures of around 80 psi can present large mechanical forces at a fluid interconnect.

BRIEF SUMMARY

The illustrative embodiments of the present disclosure provides a Direct-Interface Liquid-Cooled (DL) Rack Information Handling System (RIHS), a direct-interface liquid cooling subsystem, and a method for modularly providing liquid cooling to information technology (IT) nodes within a RIHS, where the nodes are liquid cooled (LC) nodes that contain heat-generating functional components. To reduce insertion forces LC nodes at pressurized liquid quick connections, conduits within LC nodes include a compressible fluid in addition to the incompressible fluid of liquid cooling system. An air spring is formed by a trapped gas bubble such as air in dead-end shunt conduit that communicates with a supply conduit. The trapped gas bubble can compress and expand to mitigate an abrupt pressure change during insertion of the LC node, thereby reducing the force required to make a quick connection with the liquid cooling subsystem.

According to one aspect, the an RIHS includes a rack having one or more node-receiving slots each slot having a front opening for node insertion and a rear section opposed to the front access. A node-receiving liquid inlet port and a node-receiving liquid outlet port are located at the rear section of one node-receiving slot. The node-receiving liquid inlet port and a node-receiving liquid outlet port are positioned to be inwardly facing for blind mating to a node inlet and outlet ports of a liquid-cooled (LC) node inserted in the one node-receiving slot. An LC node is insertably received in the one node-receiving slot and includes a node enclosure containing heat-generating functional components. LC nodes includes a system of conduits supplying cooling liquid through the node enclosure and including a supply conduit extending from a node inlet coupling and a return conduit terminating in a node outlet coupling. The node inlet port and the node outlet port are positioned in an outward facing direction at a rear of the node enclosure. The node inlet port and the node outlet port are aligned to releasably seal to the respective inlet liquid port and outlet liquid port in the node-receiving slot, for fluid transfer through the system of conduits. An air-spring reducer conduit is in fluid communication with the system of conduits. The air-spring reducer conduit is shaped to trap an amount of compressible fluid that compresses during sealing engagement between the node inlet coupling and node outlet coupling and the inlet liquid port and outlet liquid port, respectively.

In one aspect, a method of assembling an RIHS includes provisioning a node enclosure with heat-generating functional components. The method includes assembling with a system of conduits in fluid communication an air-spring reducer conduit. The air-spring reducer conduit is shaped to trap an amount of compressible fluid that compresses during sealing engagement between a node inlet coupling and a node outlet coupling and an inlet liquid port and an outlet liquid port, respectively. The method includes attaching the system of conduits supplying cooling liquid through the node enclosure. The system of conduits includes a supply conduit extending from the node inlet coupling and a return conduit terminating in the node outlet coupling. The node inlet port and the node outlet port positioned in an outward facing direction at a rear of the node enclosure and aligned to releasably seal to the respective inlet liquid port and outlet liquid port in the node-receiving slot, for fluid transfer through the system of conduits to form a liquid-cooled (LC) node. The method includes mounting the LC node insertably received in the one node-receiving slot of a rack having one or more node-receiving slots. Each slot has a front opening for node insertion and a rear section opposed to the front access for blind mating of the node inlet and outlet ports to a node-receiving liquid inlet port and a node-receiving liquid outlet port located at the rear section of one node-receiving slot. The node-receiving inlet and outlet ports are positioned to be inwardly facing to the LC node inserted in the one node-receiving slot.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 5 illustrates a rear perspective view of the example DL RIHS of FIG. 4 with a louvered rear door in a closed position over uncovered MLD conduits, according to one or more embodiments;

FIG. 6 illustrates a rear perspective view of the example DL RIHS of FIG. 4 with the louvered rear door opened to expose node-to-node interconnection of MLD conduits of different vertical sizes having appropriately sized and removable pipe covers, according to one or more embodiments;

FIG. 12 illustrates a front perspective view of the P-trap air spring reducer conduit of FIG. 8 that has a dog-leg shape, according to one or more embodiments;

FIG. 13 illustrates a side perspective view of the P-trap air-spring reducer conduit of FIG. 12, according to one or more embodiments;

FIG. 14 illustrates a side perspective view of an example air spring reducer conduit having an arched, hooked shape, according to one or more embodiments.

DETAILED DESCRIPTION

Figure 1:
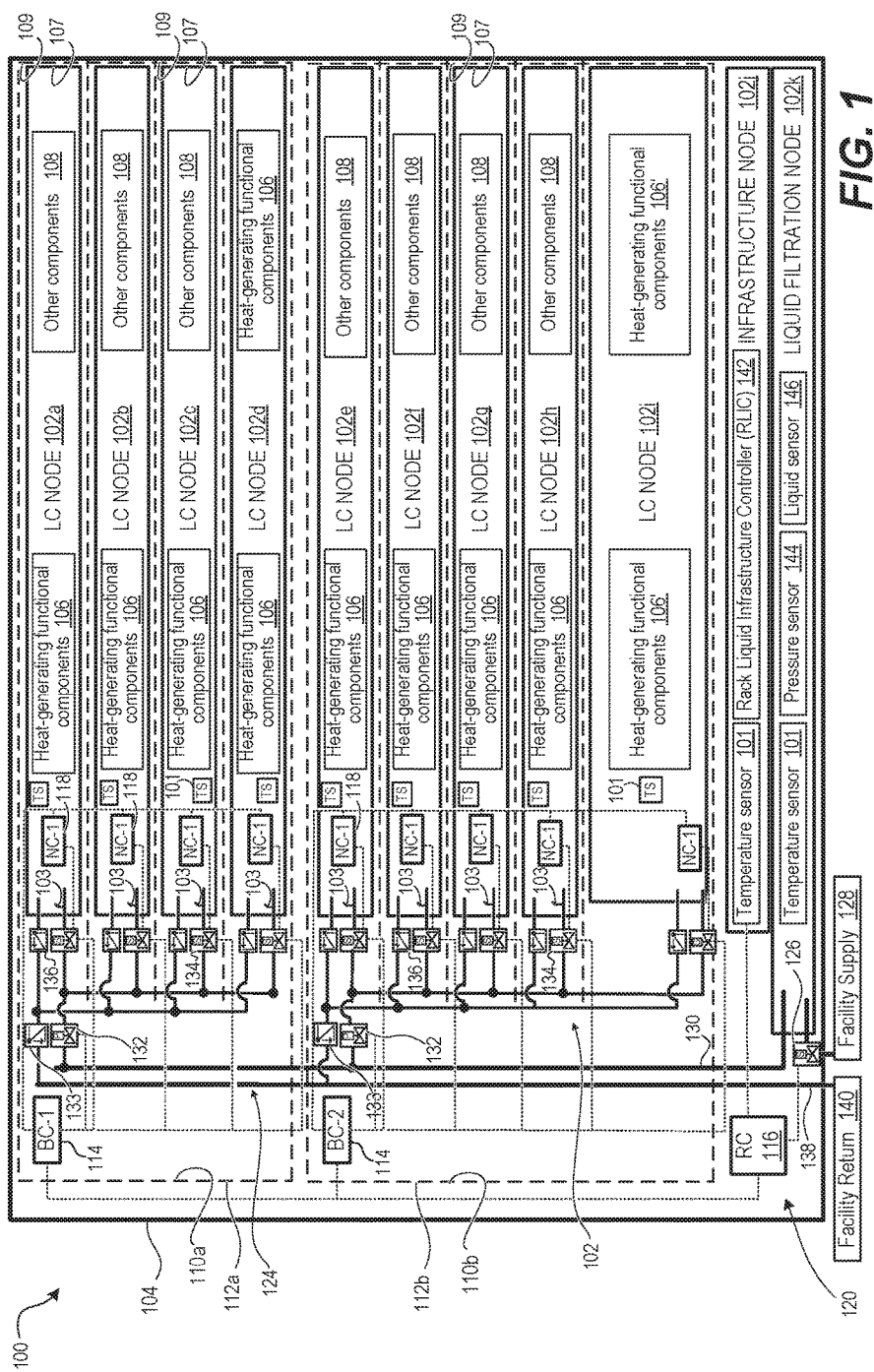
FIG. 1 illustrates a side perspective view of an internal layout/configuration of an example Direct-Interface Liquid-Cooled (DL) RIHS, according to one or more embodiments.

The present disclosure generally provides a Direct-Interface Liquid-Cooled (DL) Rack Information Handling System (RIHS) providing liquid cooled (LC) information technology (IT) nodes containing heat-generating functional components and which are cooled at least in part by a liquid cooling subsystem. The RIHS includes a rack configured with chassis-receiving bays in which is received a respective chassis of one of the LC nodes. Each LC node is configured with a system of conduits to receive direct intake/flow of cooling liquid to regulate the ambient temperature of the node. Additionally, each LC node, configured with a system of conduits, provides cooling to the components inside the node by conductively absorbing, via the cooling liquid, heat generated by the heat-generating functional components. The absorbed heat is removed (or transferred away) from within the node to outside of the node and/or the RIHS.

As data center cooling technologies continues their path toward the most energy efficient solution, liquid cooling is becoming a primary method for heat rejection. As such, quick connection systems are becoming the norm to enable blind mate instillation of liquid cooled IT equipment in an IT rack while maintaining the integrity of the liquid network. While quick connections provide a unique method for hardware insertion/removal, the incompressibility of the operating fluid creates challenges. Facility operating pressures, which can exceed 60 psi, can pressurize the quick connect ports, and pose an extreme challenge to reinsert the quick connect. The user is then required to overcome the system static pressure, as well as the pressure caused by the travel of the quick connections which can cause insertion force requirements that may pose difficulty to a user. A solution is needed to mitigate the additional insertion force due to the quick connection travel and the incompressibility of the operating fluid.

A fluid network with a unique P-trap/Air Spring Reducer maintains a compressible fluid within the incompressible fluid network. Air-spring reducer conduit is tunable based upon the volume of air in the geometry. A larger diameter or longer length of pipe can be selected to provide for more compressibility. Air follows the ideal gas law where P is directly related to density of air under compression. For system leak testing, a valve/connection may be added to top of the P trap to increase system pressure for validation testing without inducing air into the fluid network. The air-spring reducer conduit can be located between a quick connection on the exterior of a node enclosure and the next component of the fluid network. The geometry can be orientated such that the liquid fluid level contains an air pocket at the end of the device. Air will be at the highest location of the local fluid network. In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1 U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS.

Certain aspect of the disclosure then relate to the specific LC (sever or other) nodes and the functionality associated with these individual nodes or block-level groupings of nodes, while other aspects more generally relate to the overall DL RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks. The present disclosure addresses and overcomes the challenges with distributing liquid cooling fluids throughout an IT rack having nodes with a large number of variations in distribution components.

The disclosure also includes the additional consideration that in addition to cooling the primary heat generating components of the rack, such as the processor, what is needed is a way to allow for cooling of secondary equipment within the rack, as well as auxiliary components that would further support utilizing the advantages of a fluid-to-fluid heat exchanger methodology. Additionally, the present disclosure provides a modular approach to utilizing an air-to-liquid heat exchanger with quick connection and scalability to allow the solution to be scalable in both 1 U and 2 U increments.

FIG. 1 illustrates a side perspective view of an internal layout/configuration of an example DL RIHS 100 configured with a plurality of LC nodes 102, according to one or more embodiments. For simplicity, the example DL RIHS presented in the various illustrations can be described herein as simply RIHS 100; however, references to RIHS 100 are understood to refer to a DL RIHS, with the associated liquid cooling infrastructure and/or subsystems and supported LC nodes 102. RIHS 100 includes rack 104, which comprises a rack frame and side panels, creating a front-to-back cabinet within which a plurality of chassis receiving bays are vertically arranged and in which a chassis of a respective IT node 102 can be inserted. Rack 104 includes certain physical support structures (not specifically shown) that support IT gear insertion at each node location. Additional description of the structural make-up of an example rack is provided in the description of FIGS. 2-4, which follows.

FIG. 1 depicts an illustrative example of LC nodes 102a-102j (collectively refer to as nodes 102), with each nodes 102a-102i including heat-generating functional components 106. Additionally, RIHS 100 also includes an infrastructure node 102j and liquid filtration node 102k, which do not necessarily include heat-generating functional components 106 that require liquid cooling, as the other LC nodes 102a-102i. In the illustrative embodiments, nodes 102a-102b, and 102e-102h include other components 108 that are not necessarily heat generating, but which are exposed to the same ambient heat conditions as the heat generating components by virtue of their location within the node. In one embodiment, these other components 108 can be sufficiently cooled by the direct-intake/flow of cooling liquid applied to the node and/or using forced or convective air movement, as described later herein. Each node 102 is supported and protected by a respective node enclosure 107. Nodes 102a-102d are further received in node receiving bays 109 of a first block chassis 110a of a first block 112a. Nodes 102e-102i are received in a second block chassis 110b of a second block 112b. In the illustrative embodiments, the nodes 102 are vertically arranged. In one or more alternate embodiments, at least portions of the nodes 102 (and potentially all of the nodes) may also be arranged horizontally while benefitting from aspects of the present innovation.

The present innovation is not limited to any specific number or configuration of nodes 102 or blocks 112 in a rack 104. According to one aspect, nodes 102 can be of different physical heights of form factors (e.g., 1 U, 1.5 U, 2 U), and the described features can also be applied to nodes 102 having different widths and depths (into the rack), with some extensions made and/or lateral modifications to the placement of cooling subsystem conduits, as needed to accommodate the different physical dimensions. As a specific example, node 102i is depicted as having a larger node enclosure 107' (with corresponding different dimensions of heat-generating functional components 106') of a different number of rack units in physical height (e.g., 2 U) that differs from the heights (e.g., 1 U) of the other nodes 102a-102h and 102j-102k. RIHS 100 can include blocks 112 or nodes 102 selectably of a range of discrete rack units. Also, different types of IT components can be provided within each node 102, with each node possibly performing different functions within RIHS 100. Thus, for example, a given node 102 may include one of a server module, a power module, a control module, or a storage module. In a simplest configuration, the nodes 102 can be individual nodes operating independent of each other, with the RIHS 100 including at least one rack-level controller (RC) 116 for controlling operational conditions within the RIHS 100, such as temperature, power consumption, communication, and the like. Each node 102 is then equipped with a node-level controller (NC) 118 that communicates with the rack-level controller 116 to provide localized control of the operational conditions of the node 102. In the more standard configuration of a DL RIHS 100, and in line with the described embodiments, RIHS 100 also includes block-level controllers (BCs) 114, communicatively coupled to the rack-level controller 116 and performing block-level control functions for the LC nodes within the specific block. In this configuration, the nodes 102 are arranged into blocks 112, with each block 112 having one or more nodes 102 and a corresponding block-level controller 114. Note the blocks do not necessarily include the same number of nodes, and a block can include a single node, in some implementations.

A DL subsystem (generally shown as being within the RIHS and labelled herein as 120) provides direct-intake/flow of cooling liquid to heat-generating functional components 106 via a liquid rail 124 under the control of the rack-level controller 116, block-level controllers 114, and/or node-level controllers 118, in some embodiments. Rack-level controller 116 controls a supply valve 126, such as a solenoid valve, to allow cooling liquid, such as water, to be received from a facility supply 128. The cooling liquid is received from facility supply 128 and is passed through liquid filtration node 102l before being passed through supply conduit 130 of liquid rail 124. Each block 112a, 112b receives a dynamically controlled amount of the cooling liquid via block-level dynamic control valve 132, such as a proportional valve. Return flow from each block 112a, 112b can be protected from backflow by block-level (or block) check valve 133. The individual needs of the respective nodes 102a-102d of block 112a can be dynamically provided by respective node-level dynamic control valves 134, controlled by the block-level controller 114, which control can, in some embodiments, be facilitated by the node-level controllers 118. In addition to allocating cooling liquid in accordance with cooling requirements (which can be optimized for considerations such as performance and economy), each of the supply valve 126 and/or dynamic control valves 132, 134 can be individually closed to mitigate a leak. A check valve 136 is provided between each node 102a-102j and a return conduit 138 of the liquid rail 124 to prevent a backflow into the nodes 102a-102j. The return conduit 138 returns the cooling liquid to a facility return 140.

To support the temperature control aspects of the overall system, RIHS 100 includes temperature sensors 101 that are each located within or proximate to each node 102a-102j, with each temperature sensor 101 connected to the node-level controller 118 and/or the corresponding block-level controller 114. Temperature sensors 101 operate in a feedback control loop of the liquid cooling subsystem 122 to control the amount of liquid flow required to cool the nodes 102a-102j. In one or more embodiments, the rack-level controller 116 can coordinate performance constraints to block-level controllers 114 and/or node-level controllers 118 that limit an amount of heat generated by the heat-generating functional components 106 to match a heat capacity of the flow of cooling liquid in DL subsystem 122. Alternatively or in addition, the rack-level controller 116 can coordinate cooling levels to block-level controllers 114 and/or node-level controllers 118 that in turn control the dynamic control valves 132, 134 for absorption and transfer of the heat generated by the heat-generating functional components 106 by the DL subsystem 122. In one or more embodiments, support controllers such as a Rack Liquid Infrastructure Controller (RLIC) 142 can perform management and operational testing of DL subsystem 122. RLIC 142 can monitor pressure sensors 144 and liquid sensors 146 to detect a leak, to validate operation of a dynamic control valves 132, 134 or shut-off valves such as supply valve 126. RLIC 142 can perform close-loop control of specific flow rates within the RIHS 100.

To provide for availability of service by the computing components of the RIHS, nodes 102a-102h can be hot pluggable. For example the node enclosure 107 can be inserted into the rack 104 with other nodes 102a-102h continuing to be serviced by the DL subsystem 120. Providing sufficient fluid pressure through the DL subsystem for adequate cooling capacity can create significant mechanical forces to achieve a good seal between quick coupling connectors. To mitigate peak forces, nodes 102a-102h include an air-spring reducer conduit 103 that traps a compressible fluid such as air. Engagement forces transferred through an incompressible cooling liquid such as water can be dampened by the air-spring reducer conduit 103.

Figure 2:
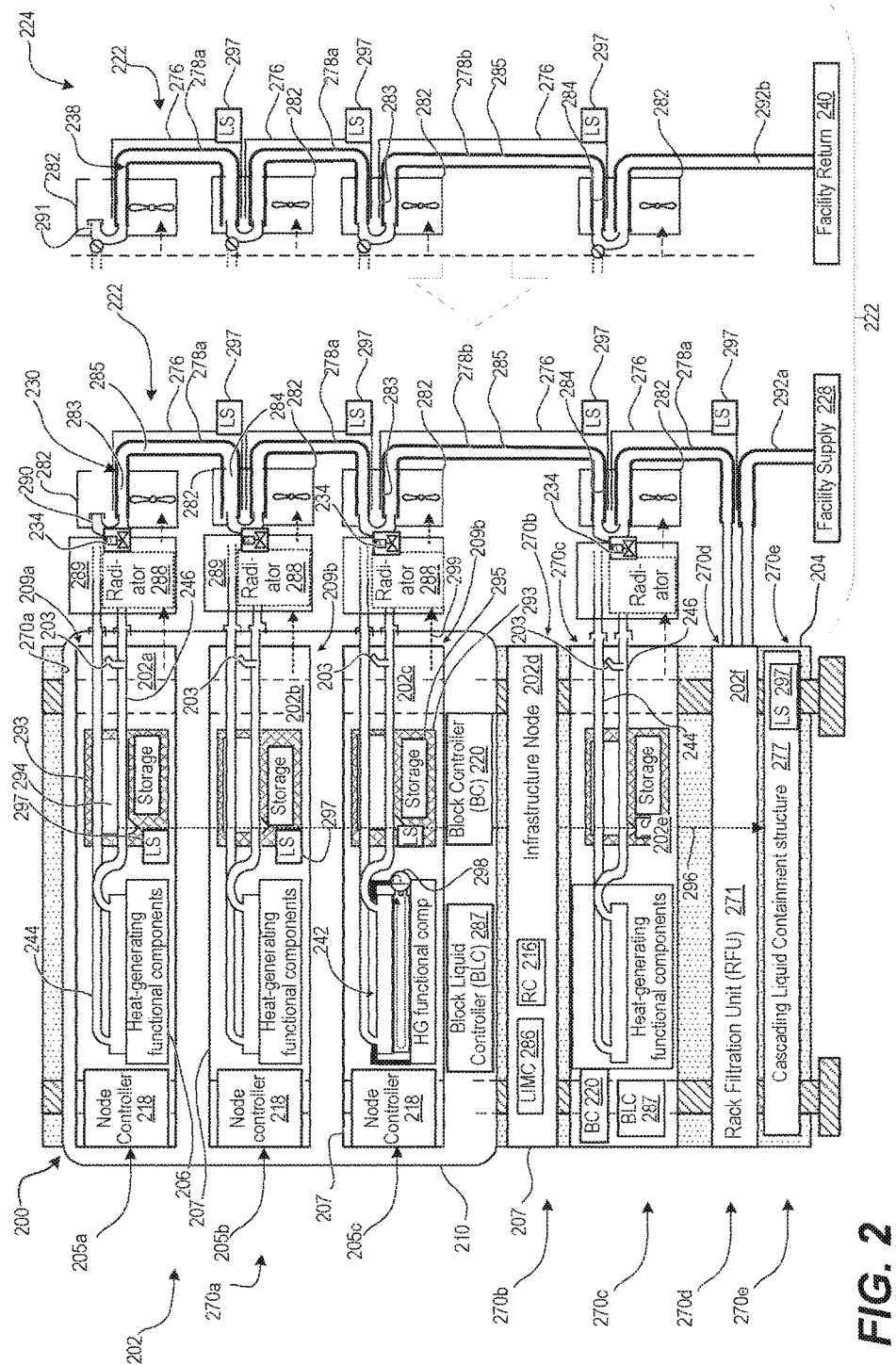
FIG. 2 illustrates a detailed block diagram of a DL RIHS configured with LC nodes arranged in blocks and which are cooled in part by a liquid cooling subsystem having a rail comprised of MLD conduits, and in part by a subsystem of air-liquid heat exchangers, according to multiple embodiments.

FIG. 2 illustrates a more detailed view of the interconnections of the liquid cooling subsystem, at a node level and rack level within an example DL RIHS 200. As shown, RIHS 200 is configured with LC nodes 202a-202e arranged in blocks (e.g., block 1 comprising 202a-802c) and which are cooled in part by a liquid cooling subsystem having a liquid rail comprised of MLD conduits, and in part by a subsystem of air-liquid heat exchangers, can be configured with heat-generating functional components 206 and that are cooled at least in part by a system of MLD conduits 278a-278b, according to one or more embodiments. Illustrated within nodes 202 are heat-generating functional components 206, such as processors, voltage regulators, etc., which emit heat during operation and or when power is applied to the component, such that the ambient temperature increases around the component, and within the node, and eventually within the block, and ultimately DL RIHS 200, during standard operation. To mitigate heat dissipation (and effects thereof), and to maintain the RIHS, block, node, and functional components within proper operating temperatures, DL RIHS 200 is configured with DL subsystem 222. DL subsystem 222 includes a rack level network of liquid propagating pipes, or conduits that are in fluid communication with individual node level networks of liquid propagating conduits. Additionally, DL subsystem 222 collectively facilitates heat absorption and removal at the component level, the node level, the block level, and/or the rack level. The rack-level network of conduits includes a modular arrangement of a liquid rail 224 formed by more than one node-to-node MLD conduit 278a-278b spanning (or extending) between LC nodes 202 provisioned in rack 204.

At the top position of RIHS 200, a block chassis 210 is received in a block chassis receiving bay 270a of rack 204. Within block chassis 210, a first node 202a received in a first node receiving bay 209a of the rack 204 has a vertical height of one rack unit (1 U). A rack unit, U or RU as a unit of measure, describes the height of electronic equipment designed to mount in a 19-inch rack or a 13-inch rack. The 19 inches (482.60 mm) or 13 inches (584.20 mm) dimension reflects the horizontal lateral width of the equipment mounting-frame in the rack including the frame; the width of the equipment that can be mounted inside the rack is less. According to current convention, one rack unit is 1.75 inches (44.45 mm) high. A second node 202b received in a second node receiving bay 209b of the rack 104 (of FIG. 1) has a vertical height of 1 U. A third node 202c received in a third node receiving bay 209c of the rack 204 has a vertical height of 1 U. A fourth node 202d, infrastructure node 202b, is received in a second block chassis receiving bay 270b of rack 204 and has a vertical height of 1 U. Infrastructure node 202b can contain functional components such as a rack-level controller 216. A fifth node 202e is received in a third chassis receiving bay 270c and has a vertical height of 2 U. A sixth node 202f, which provides a Rack Filtration Unit (RFU) 271, is received in a fourth block chassis receiving bay 270d of the rack 204. Infrastructure node 202 and RFU 271 are examples of nodes 202 that may not require liquid cooling. A cascading liquid containment structure 277 is received in a fifth chassis receiving bay 270e and includes liquid sensor 297.

MLD conduits 278a of 1 U can be used to connect nodes of 1 U vertical spacing. Because of the additional 1 U separation of LC nodes 202c and 202e by inclusion of infrastructure node 202d, MLD conduit 278b between the third and fifth nodes 202c-202d is dimension 2 U to accommodate the increased spacing. MLD conduits 278a-278b can thus support different heights (1 U to NU) of IT components.

Each MLD conduit 278a-278b includes first and second terminal connections 283, 284 attached on opposite ends of central conduit 285 that is rack-unit dimensioned to seal to a port of LC node 202 and enable fluid transfer between a port of a selected LC node 202 and a port of an adjacent LC node 202. In FIG. 2, facility supply 228 and facility return 240 are respectively located at the intake end of liquid rail 224 and the exhaust end of liquid rail 224. The actual location of facility supply 228 and facility return 240 can be reversed. Alternatively, facility supply 228 and facility return 240 can be located above the RIHS 200 or both conduits can be located on opposite sides of the RIHS 200 in alternate embodiments.

Liquid cooling subsystem 222 includes a liquid infrastructure manager controller (LIMC) 286 which is communicatively coupled to block liquid controllers (BLCs) 287 to collectively control the amount of cooling liquid that flows through the RIHS 200 and ultimately through each of the nodes 202 in order to effect a desired amount of liquid cooling at the component level, node level, block level, and rack level. For clarity, LIMC 286 and BLCs 287 are depicted as separate components. In one or more embodiments, the liquid control features of the LIMC 286 and BLCs 287 can be incorporated into one or more of the rack-level controller 216, block-level controllers 220, and the node-level controllers 218. As illustrated in FIG. 1 and previously described, each of the LIMC 286 and BLCs 287 are connected to and respectively control the opening and closing of flow control valves that determine the amount of flow rate applied to each block and to each node within the specific block. During cooling operations, one of LIMC 286 and BLC 287 causes a specific amount of liquid to be directly injected into the intake conduits of the LC node 202, which forces the cooling liquid through the system of conduits within the LC node 202 to the relevant areas and/or functional components/devices inside the nodes 202 to absorb and remove heat away from the inside of the node and/or from around the components within the node.

As another aspect, the present disclosure provides a modular approach to utilizing air-to-liquid heat exchanger 288 with quick connection and is scalable in both 1 U and 2 U increments. In one or more embodiments, DL cooling subsystem 222 can include a plurality of air-to-liquid (or liquid-to-air) heat exchangers 288 that facilitate the release of some of the heat absorbed by the exhaust liquid to the surrounding atmosphere around the RIHS 100 (of FIG. 1). Air-to-liquid heat exchangers 288 can be integral to block liquid manifold 289 that, along with the MLD conduits 278a-278b, form scalable liquid rail 224. One aspect of the present disclosure is directed to providing scalable rack-mounted air-to-liquid heat exchanger 288 for targeted heat rejection of rack-mounted equipment to DL cooling subsystem 222. Hot air 299 from auxiliary components, such as storage device 295, would be pushed through the air-to-liquid heat exchanger 288, and the resulting energy would transfer to liquid rail 224 and be rejected to a facility cooling loop, represented by the facility return 240.

RIHS 200 can include variations in LC node 202 that still maintain uniformity in interconnections along liquid rail 224 formed by a chassis-to-chassis modular interconnect system of MLD conduits 278a-278b. With this scalability feature accomplished using MLD conduits 278a-278b, cooling subsystem 222 of the RIHS 200 allows each block chassis 210 to be a section of a scalable manifold, referred herein as liquid rail 224, eliminating the need for a rack manifold. The scalability of liquid rail 224 enables flexible configurations to include various permutations of server and switch gear within the same rack (rack 204). MLD conduits 278a-278b can comprise standardized hoses with sealable (water tight) end connectors. Thus, the rack liquid flow network can encompass 1 to N IT chassis without impacting rack topology, space constraints, and without requiring unique rack manifolds. Additionally, according to one aspect, the MLD conduits are arranged in a pseudo daisy chain modular configuration, which allows for unplugging of one MLD conduit from one rack level without affecting liquid flow to and cooling of other rack levels.

The system of conduits extending from node intake valve 234 into each LC node 202 enables each LC node 202 to engage to block liquid manifold 289. Block chassis 210 or node enclosure 207 of each LC node 102 provides the intake and exhaust conduit connections to engage to respective terminals of MLD conduits 278a-278b within the MLD network provided by liquid rail 224. For example, where nodes 202 are designed as sleds, node enclosure 207 would be a sled tray, and each block would then include more than one sled tray received into block chassis 210, forming the extensions of block liquid manifold 289. Alternatively, the node enclosure 207 can be a single node chassis such as one of nodes 202c-202f.

Supply and return bypass tubes 290, 291 of each block liquid manifold 289 are connected by MLD conduits 278a-278b to form supply rail conduit 230 and return rail conduit 238. For clarity, FIG. 2 illustrates the return rail conduit 238 separately. Liquid rail 224 enables multiple types of devices to be coupled together, each receiving an appropriately controlled portion of cooling liquid capacity. In one embodiment, liquid cooling subsystem 222 is passively pressurized by attaching MLD supply conduit 292a to facility supply 228 and an MLD return conduit 292b to facility return 240. Liquid flow from supply rail conduit 230 to return rail conduit 238 of liquid rail 224 can be controlled based upon factors such as a temperature of the liquid coolant, detected temperature within LC nodes 202, air temperature inside or outside of DL RIHS 200, etc.

In an exemplary embodiment, the scalable rack manifold provided by liquid rail 224 is formed in part by MLD conduits 278a-278b that run vertically in the back of the RIHS 200 with quick disconnects on the front and rear face of block liquid manifold 289 that allows for IT/infrastructure equipment respectively to be plugged into both front and back sides of the block liquid manifold 289. For example, LC nodes 202, such as server modules, can plug into the front side and fan modules 282 can plug onto the back side of block liquid manifold 289. This also allows for other liquid cooled devices such as LC Power Distribution Units (PDUs) to be plugged into the cooling liquid supply rail conduit 230 and return rail conduit 238 of liquid rail 224. Thereby, a rack hot pluggable cooling interface is created for any rack-mounted equipment.

Cooling subsystem 222 can support an embedded liquid-to-liquid heat exchanger manifold 242, such as in LC node 202c. Node liquid-to-liquid heat exchangers are provided for rejecting heat from one fluid source to a secondary source. One aspect of the present disclosure solves the problems that many shared-infrastructure IT systems (e.g., blade chassis) do not have adequate space to accommodate a liquid-to-liquid heat exchanger. Unlike with generally-known systems that rely upon liquid heat transfer having to exchange heat with an external liquid-to-liquid heat exchanger, the present disclosure enables on-rack liquid-to-liquid heat exchanger that does not require any of the vertical chassis space. Additionally, the present disclosure provides these benefits without requiring a central distribution unit (CDU), which takes up datacenter floor space. One aspect of the present disclosure provides embedded heat exchanger manifold 242 having a common heat transfer plate and a shared bulk header to create a combined liquid distribution manifold that includes a secondary liquid coolant for absorbing heat through the shared bulk header. In particular, the combined embedded heat exchanger manifold 242 rejects heat within shared node enclosure 207 such as node 202c to a secondary liquid coolant. Internal node supply 244 and return conduits 246 of a manifold built on top of a heat exchanger core allow heat transport within manifold 242. In one embodiment, closed system pump 298 can use a first coolant to cool a high thermal energy generating functional component such as a CPU or voltage regulator.

Additionally, the liquid cooling subsystem 222 also includes a filtration system or unit 271, which prevents chemical impurities and particulates from clogging or otherwise damaging the conduits as the fluid passes through the network of conduits. According to one aspect of the disclosure, liquid cooling subsystem 222 provides RFU 271 in fluid connection with the intake pipes from facility supply 228. In at least one embodiment, RFU 271 includes a sequenced arrangement of liquid filters within a full-sized sled that can be removably inserted by an end user into one of the receiving slots of rack 204. In one embodiment, the RFU 271 is located on an infrastructure sled having rack-level controllers and other rack-level functional components. In at least one embodiment, the entirety of the sled is filed with components associated with RFU 271. Thus, it is appreciated that the RFU 271 may occupy the entire area of one vertical slot/position within the chassis. Alternate locations of the RFU 271 can also be provided, in different embodiments, with an ideal location presenting the intake port of the RFU 271 in close proximity to a connection to facility supply 228 to directly receive the facility supply 228 prior to the liquid being passed into the remainder of the conduits of the liquid cooling subsystem 222. It is appreciated that if the system was capable of completing all heat exchange within the rack, then sealing the rack would be feasible and would reduce and/or remove any requirements for filtration and/or allocation of rack space for RFU 271.

Liquid-cooled compute systems use the high heat transport capacity of water. However, the disclosure recognizes and addresses the fact that with liquid introduced into an electronic enclosure, there is a potential for leaks that can cause catastrophic system failure. Also, in some instances, a leak can create an electronic short with a resulting exothermal reaction causing permanent damage to the DL RIHS 200. To mitigate such risks, as one design feature, node-level carrier 293 can include a trench/gutter system for use as liquid containment structure 294. In one embodiment, the gutter system can also incorporate an absorbent material that can accumulate sufficient amounts of liquid from small leaks to enable external sensing of the leak. Advantageously, the carrier 293 can also be thermally conductive to serve as a heat sink for components such as storage devices 295. In one embodiment, another leak detection solution that can be incorporated into the LC node 202 involves use of a solenoid to create an event when additional current is applied, due to water pooling around the solenoid. Barriers on carrier 293 can be specifically designed to contain a liquid leak and assist in funneling the liquid through the gutter system. Liquid rail 224 can also be provided with leak containment and detection. In one or more embodiments, removable pipe covers 276 are sized to be mounted around respective MLD conduits 278a-278b and can include liquid sensors 297 for automatic alerts and shutdown measures.

In one or more embodiments, DL RIHS 200 further incorporates a node-level liquid containment structure 290 with a cascading drain runoff tubing network 296 to a rack-level cascading liquid containment structure 294. In one or more embodiments, the DL RIHS 200 further incorporates leak detection response such as partial or complete automated emergency shutdown. Liquid sensors (LS) 297 at various cascade levels can identify affected portions of DL RIHS 200. Containment and automatic shutoff can address the risks associated with a leak developing in the DL cooling system 222.

RIHS 200 can facilitate maintenance and upgrade activities of certain nodes 202a-202c with other nodes continuing to operate. The rack 204 has one or more node-receiving slots 205a-205c. Each slot 205a-205c has a front opening for node insertion and a rear section opposed to the front access. The node-receiving slots 205a-205c are defined within block chassis 210. Hot plugging of a node 202a-202c can include a large force if coupling requires displacement of fluid retained in the internal node supply conduit 244. The fluid may be trapped within the node 202a-202c until valves open. To reduce the force required, an air-spring reducer conduit 203 attached as a dead-end conduit shunt has a raised arch that traps a bubble of air that compresses in response to a pressure spike. The node 202d can also be a block in and of itself and can also benefit from having an air-spring reducer conduit 103. Other components such as the RFU 271 can include a purge capability with active components that can be triggered to release pressure to allow insertion.

Figure 3:
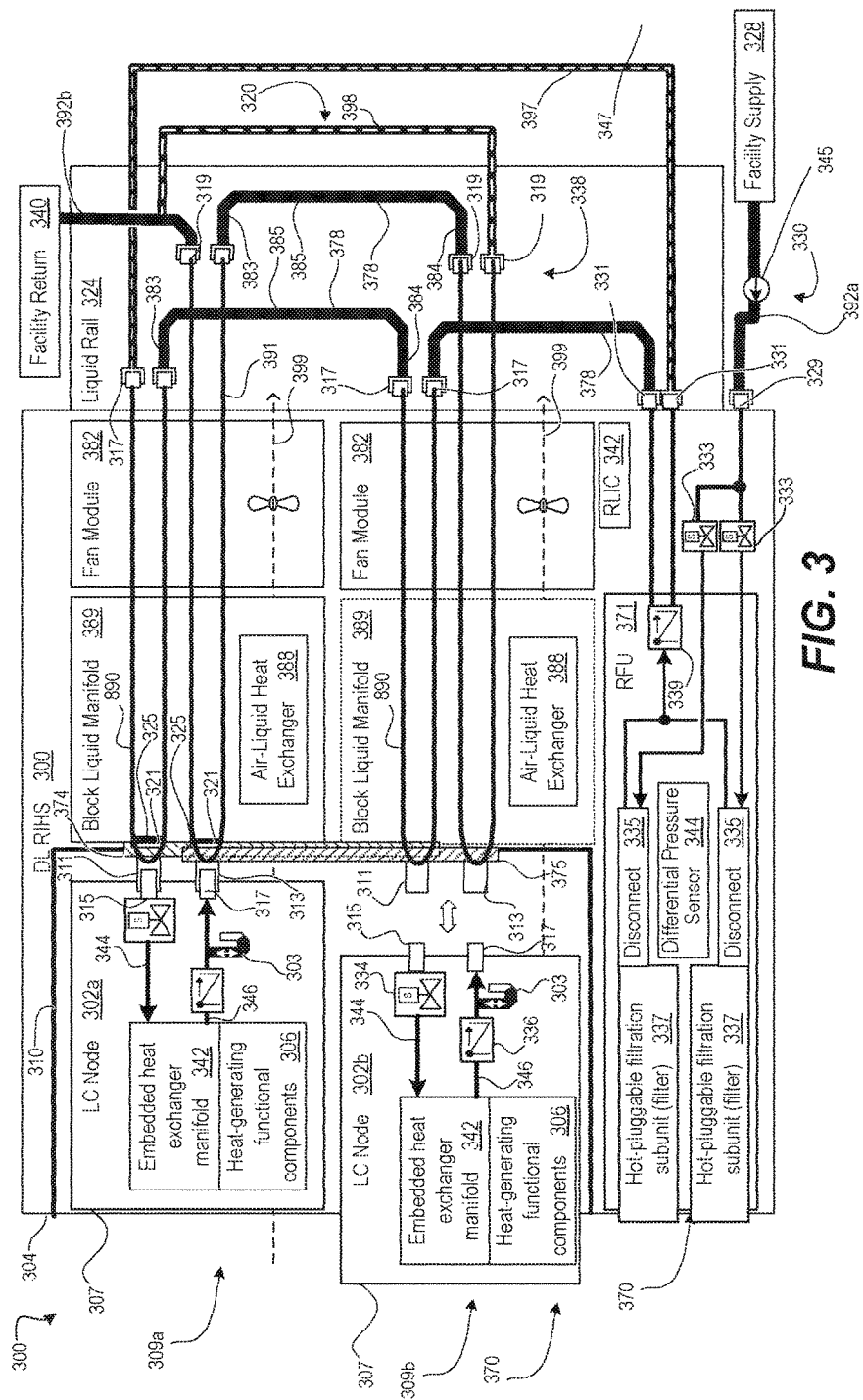
FIG. 3 illustrates an expanded, more detailed view of the liquid interconnection between the node level heat exchange manifold, the block liquid manifold containing the air-liquid heat exchanger, and example MLDs of the liquid rail, according to multiple embodiments.
Figure 4:
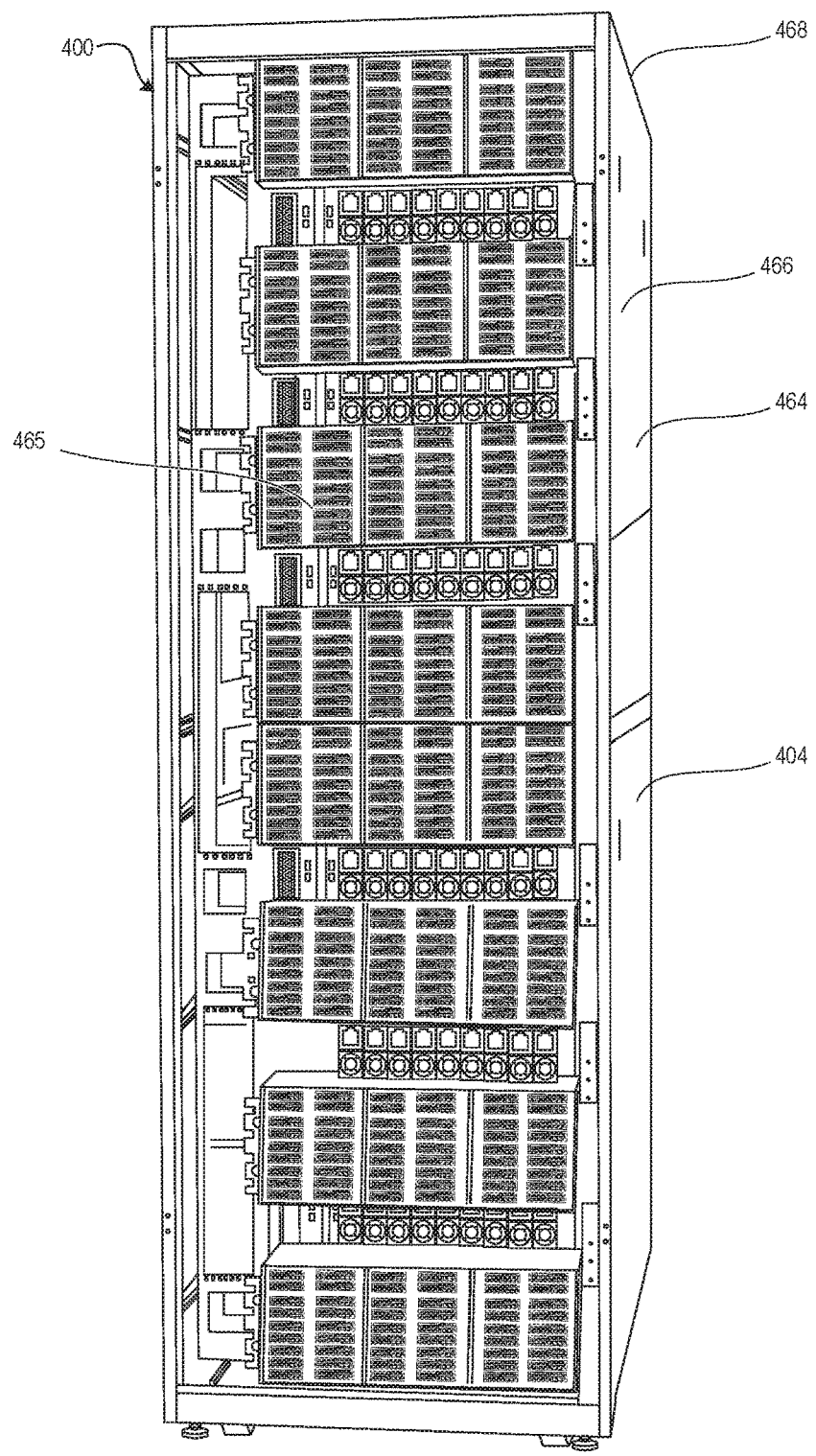
FIG. 4 illustrates a front perspective view of an example DL RIHS with front removable nodes, according to one or more embodiments.

FIG. 3 illustrates a more detailed view of DL subsystem 320 associated with example DL RIHS 300. Within DL RIHS 300, each LC node 302a, 302b includes chassis 310 received in a respective chassis-receiving bay 370 of rack 304. Each LC node 302a, 302b contains heat-generating functional components 306. Each LC node 302a, 302b is configured with a system of internal supply conduit 344 and return conduit 346, associated with embedded heat exchanger manifold 342. Embedded heat exchanger manifold 342 receives direct intake/flow of cooling liquid to regulate the ambient temperature of LC node 302a, 302b. A node-level dynamic control valve 334 and node-level return check valve 336 control an amount of normal flow and provide shutoff and/or otherwise mitigate a leak. Cooling subsystem 320 provides cooling to heat-generating functional components 306 inside the LC node 302a, 302b by removing heat generated by heat-generating functional components 306. Liquid rail 324 is formed from more than one node-to-node, MLD conduit 378 between more than one LC node 302a, 302b within in rack 304. MLD conduits 378 includes first terminal connection 383 and second terminal connection 384. First terminal connection 383 and second terminal connection 384 are attached on opposite ends of central conduit 385. Central conduit 385 is rack-unit dimensioned to directly mate and seal to and enable fluid transfer between a selected pair of rail supply ports 317 and/or rail return ports 319 of a selected LC node 302a and an adjacent LC node 302b.

The cooling subsystem 320 includes block liquid manifolds 389 mountable at a back side of the rack 304. Each block liquid manifold has at least one rail supply port 317 and at least one rail return port 319 on an outside facing side of the block liquid manifold 389. The at least one rail supply port 317 and the at least one rail return port 319 respectively communicate with at least one block supply port 321 and a block return port 323 on an inside facing side of the block liquid manifold 389. LC nodes 302 are insertable in receiving bays 370 of rack 304 corresponding to locations of the mounted block liquid manifolds 389. Block supply ports 321 and block return ports 323 of the LC nodes 302 and an inside facing portion of the corresponding block liquid manifold 389 are linearly aligned. The linear alignment enables direct sealing, for fluid transfer, of the lineally aligned inside manifold supply ports 325 and return ports 327 to the inside facing portion of the block liquid manifold 389. In one or more embodiments, block supply port 321 sealed to the internal manifold supply port 325 communicates via supply bypass tube 390 to two rail supply ports 317. Block return port 323 sealed to internal manifold return port 327 communicates via return bypass tube 391 of the respective block liquid manifold 389 to two rail return ports 319. Fan modules 382 mounted respectively onto back of block liquid manifold 389 have apertures to expose rail supply and return ports 317, 319. Additionally, fan modules 382 draw hot air 399 from LC nodes 302 through an air-liquid heat exchanger 388 in block liquid manifold 389.

In one or more embodiments, supply liquid conduit 392a is attached for fluid transfer between facility supply 328 and rail supply port 317 of block liquid manifold 389 of RIHS 300. A return liquid conduit 392b can be attached for fluid transfer between rail return port 319 of block liquid manifold 389 to facility return 340. FIG. 3 further illustrates that the fluid connection to facility supply 328 includes RFU 371. To prevent contamination or causing damage to cooling subsystem 320, RFU 371 is received in bay 370 of rack 304 and includes input port 329 connected via supply liquid conduit 392a to facility supply 328. The RFU 371 includes output port 331 that is connected to MLD conduit 378 of supply rail conduit 330. Liquid rail 324 also includes return rail conduit 338. RFU 371 controls two external emergency shutoff valves 333 for flow received from the input port 329 that is provided respectively via hot-pluggable disconnects 335 to two replaceable filtration subunits ("filters") 337. The flow of cooling liquid flows in parallel to two replaceable filtration subunits 337, automatically diverting to the other when one is removed for replacing. Thereby, filtration and cooling of RIHS 300 can be continuous. Back-flow is prevented by check valve 339 that allows normal flow to exit to output port 331. Differential pressure sensor 376 measures the pressure drop across filters") 337 and provides an electrical signal proportional to the differential pressure. According to one aspect, a Rack Liquid Infrastructure Controller (RLIC) 342 can determine that one filter 337 is clogged if the differential pressure received from differential pressure sensor 376 falls below a pre-determined value.

In one or more embodiments, RIHS 300 can provide hot-pluggable server-level liquid cooling, an integrated leak collection and detection trough, and an automatic emergency shut-off circuit. At a block level, RIHS 300 can provide embedded air-to-liquid heat exchange, and dynamic liquid flow control. At a rack level, RIHS 300 can provide facility-direct coolant delivery, a scalable rack fluid network, a rack filtration unit, and automated rack flow balancing, and a service mode.

According to one embodiment, liquid rail 324 includes a series of secondary conduits, such as supply and return divert conduits 397, 398, that provide a by-pass fluid path for each of MLD conduits 378. In operation, divert conduit 397 allows for the removal of corresponding MLD conduit 378, thus removing the flow of cooling liquid to the particular block of nodes, without interrupting the flow of cooling liquid to the other surrounding blocks of computer gear. For example, a particular MLD conduit 378 can be replaced due to a leak. For another example, a block liquid manifold 389 can be replaced. The inclusion of divert conduit 397 thus enables rapid servicing and maintenance of block liquid manifold 389 and/or nodes within block chassis without having to reconfigure the MLD conduits 378. In addition, the RIHS 300 can continue operating as cooling liquid continues to be provided to the remainder of the blocks that are plugged into the liquid rail. Re-insertion of the MLD conduit 378 then reconnects the flow of cooling liquid to the block for normal cooling operations, and shuts off the diverted flow of cooling liquid.

In one or more embodiments, each LC node 302 can receive liquid cooling service from a corresponding block liquid manifold 389 as illustrated by FIG. 3. In one or more embodiments, one or more block liquid manifolds 328 provide liquid cooling service to a block chassis 310 that in turn quick connects to more than one LC node 302a, 302b. A node-receiving liquid inlet port 311 and a node-receiving liquid outlet port 313 are located at the rear section of one node-receiving slot 309a, 309b and positioned to be inwardly facing for blind mating to a node inlet and outlet ports 315, 317 of an LC node 302a, 302b inserted in the one node-receiving slot 309a, 309b. The system of internal supply conduit 344 and return conduit 346 supply cooling liquid through the node enclosure 307. An air-spring reducer conduit 303 is attached for fluid transfer to the internal supply conduit 344. The supply conduit 344 extends from a node inlet coupling 315, which in an exemplary embodiment is a male inlet coupling. The return conduit 346 terminates in a node outlet coupling 317, which in an exemplary embodiment is a male outlet coupling. The node inlet port 315 and the node outlet port 317 are positioned in an outward facing direction at a rear of the node enclosure 307. The node inlet port 315 and the node outlet port 317 are aligned to releasably seal to the respective inlet liquid port and outlet liquid port in the node-receiving slot 309a, 309b, for fluid transfer through the system of conduits 344, 346. A block supply plenum 374 and return plenum 375 can communicate for fluid transfer between the block liquid manifold 389 and each of the supported LC nodes 302a, 302b. Modulation or shutoff of cooling liquid at the block level can also be incorporated into the block supply plenum 374 and return plenum 375.

Figure 7:
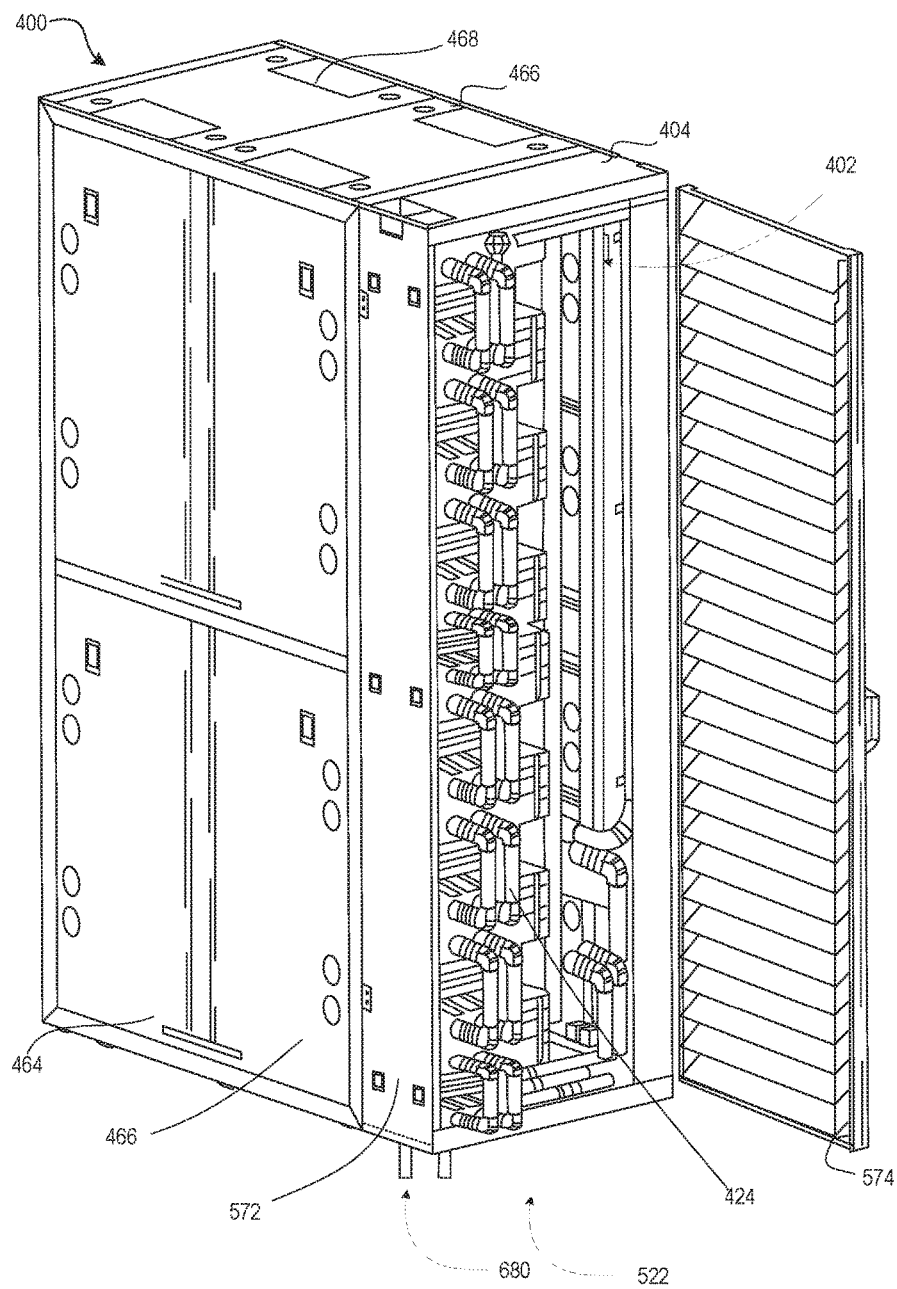
FIG. 7 illustrates the rear perspective view of FIGS. 5-6 with the pipe covers removed to expose the MLD conduits, according to one or more embodiments.

FIGS. 4-7 illustrate different exterior and rear views of an example assembled DL RIHS 400. DL RIHS 400 includes rack 404, which is a physical support structure having an exterior frame and attached side panels to create cabinet enclosure 464 providing interior chassis receiving bays (not shown) within which a plurality of individual node chasses (or sleds) of functional IT nodes, such as LC node 102 of FIG. 1, are received. In the description of the figures, similar features introduced in an earlier figure are not necessarily described again in the description of the later figures. As illustrated, rack 404 includes opposing side panels 466, attached to a top panel 468 (and bottom panel—not shown) to create the main cabinet enclosure 464 that includes multiple chassis receiving bays for housing LC nodes 102, 202, 302 (FIGS. 1-3). The created cabinet enclosure 464 includes a front access side 465 (FIG. 4) and a rear side. The front access side 465 provides access to the chassis receiving bays created within the main cabinet enclosure 464 for receiving LC nodes 102 (of FIG. 1) into rack 404. FIGS. 5-7 illustrate that attached to the rear ends of the main opposing side panels 466 are opposing side panel extensions 572. A louvered rear door 574 is hinged (or otherwise attached) to one of the side panel extensions 572 and includes a latching mechanism for holding the door 574 in a closed position, where in a closed position is relative to the otherwise open space extending laterally between opposing side panel extensions 572. Side panel extensions 572 and louvered rear door 574 provide an extension to main cabinet enclosure 464 for housing, covering/protecting, and providing access to the modular, scalable liquid rail 524 of a liquid cooling subsystem 522 that provides liquid cooling to each LC node 102 (of FIG. 1) inserted into the chassis of the main cabinet enclosure 464. Rear pipe covers 576 can protect portions of liquid rail 524 (of FIG. 5), and specifically Modular Liquid Distribution (MLD) conduits 578, from inadvertent damage as well as containing any leaks from being directed at sensitive functional components 106 (of FIG. 1).

Figure 8:
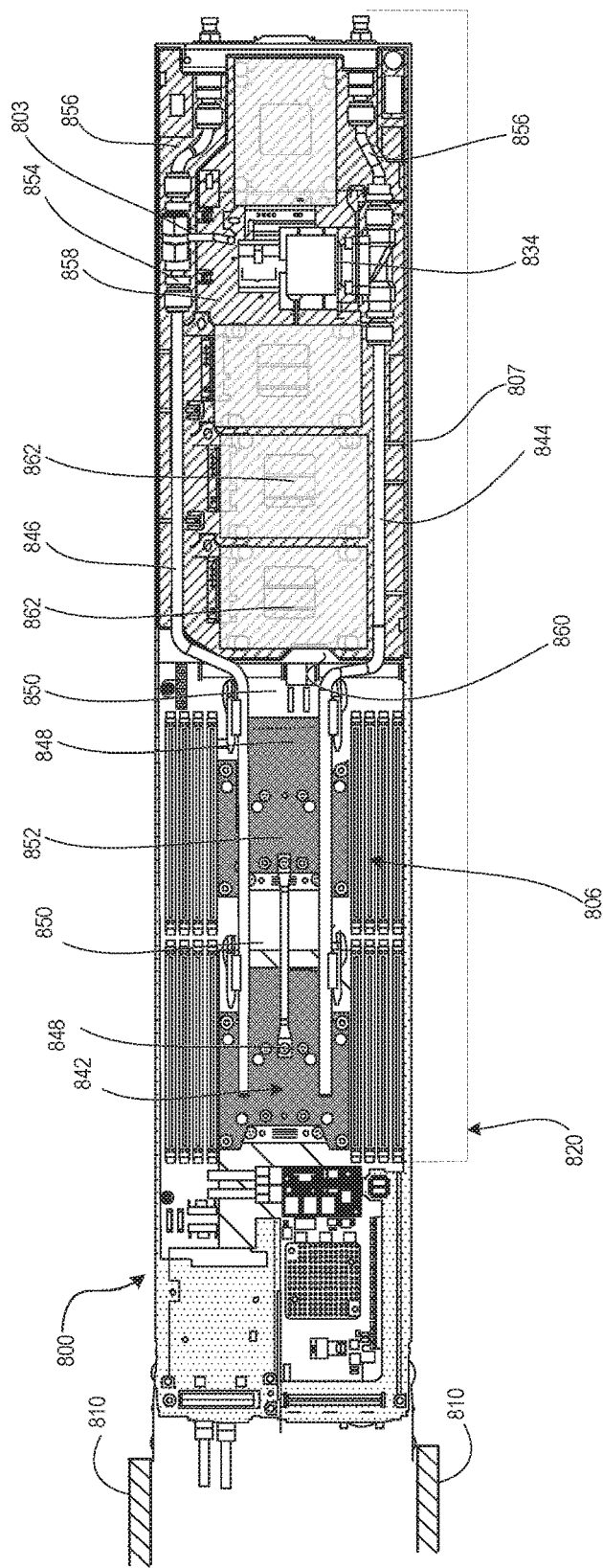
FIG. 8 illustrates a side view of an example LC node configured with a liquid cooling subsystem that includes a liquid-to-liquid manifold and cooling pipes for conductively cooling internal functional components, according to one or more embodiments.

FIG. 8 illustrates example LC node 800 of example DL RIHS 100 of FIG. 1 having a node enclosure 807 insertable into a block chassis 810. For purposes of description, node 800 is a server IHS that includes processing components or central processing units (CPUs), storage devices, and other components. LC node 800 includes cooling subsystem (generally shown and represented as 820) that includes a liquid-to-liquid manifold 842 to cool heat-generating functional components 806 by heat transfer from liquid provided by node-level supply conduit 844, and return conduit 846, according to one or more embodiments. Node-level supply conduit 844 and return conduit 846 are appropriately sized and architecturally placed relative to the other components and the dimensionality (i.e., width, height, and depth/length) of LC node 800 to permit sufficient cooling liquid to pass through the interior of LC the node 800 to remove the required amount of heat from LC node 800 in order to provide appropriate operating conditions (in terms of temperature) for the functional components located within LC node 800. Liquid-to-liquid manifold 842 can include CPU cold plates 848 and voltage regulator cold plates 850. A sled assembly grab handle 852 can be attached between CPU cold plates 848 for lifting LC node 800 out of block chassis 810. A return-side check valve 854 of the return conduit 846 can prevent facility water from back-feeding into LC node 800 such as during a leak event. Flex hose links 856 in each of node-level supply conduit 844 and return conduits 846 can reduce insertion force for sleds into block chassis 810. Sled emergency shutoff device 834 interposed in the supply conduit 844 can be a solenoid valve that closes in response to input from a hardware circuit during a sled-level leak detection event. Node-level carrier 858 received in node enclosure 807 can incorporate liquid containment structure 860 to protect storage device 862. In the illustrative example illustrated by FIG. 8, LC node 800 is oriented horizontally and is viewed from above. In one or more embodiments node-level carrier 858 is configured to route leaked cooling liquid away from storage device 862 when oriented vertically. The node-level return conduit 846 of the example LC node 802 includes P-trap air-spring reducer conduit 803.

Figure 9:
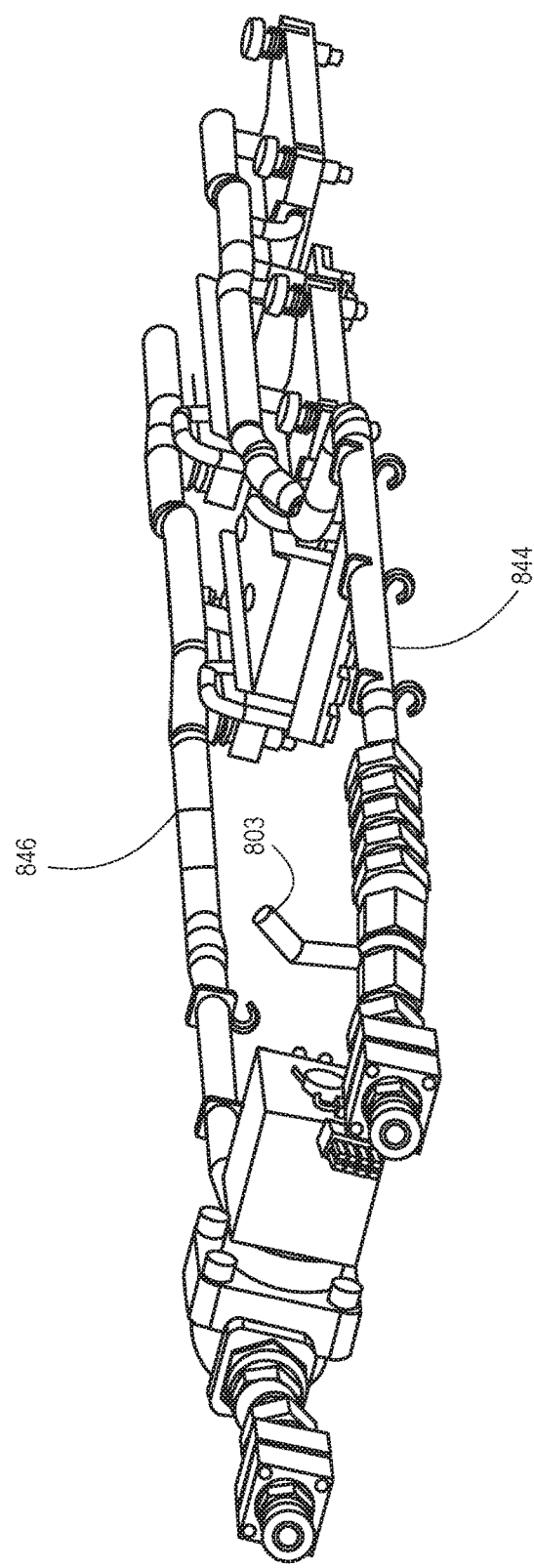
FIG. 9 illustrates a front perspective view of a system of conduits of the example LC node of FIG. 8 including a P-trap air-spring reducer conduit, according to one or more embodiments.
Figure 10:
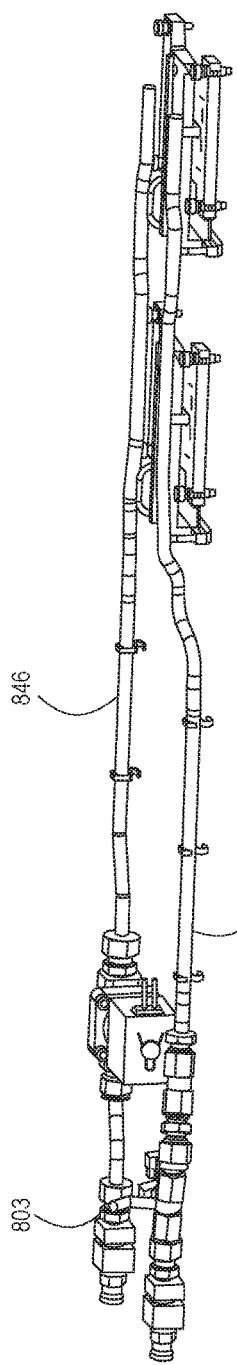
FIG. 10 illustrates a side perspective view of a system of conduits of the example LC node of FIG. 8 including a P-trap air-spring reducer conduit, according to one or more embodiments.
Figure 11:
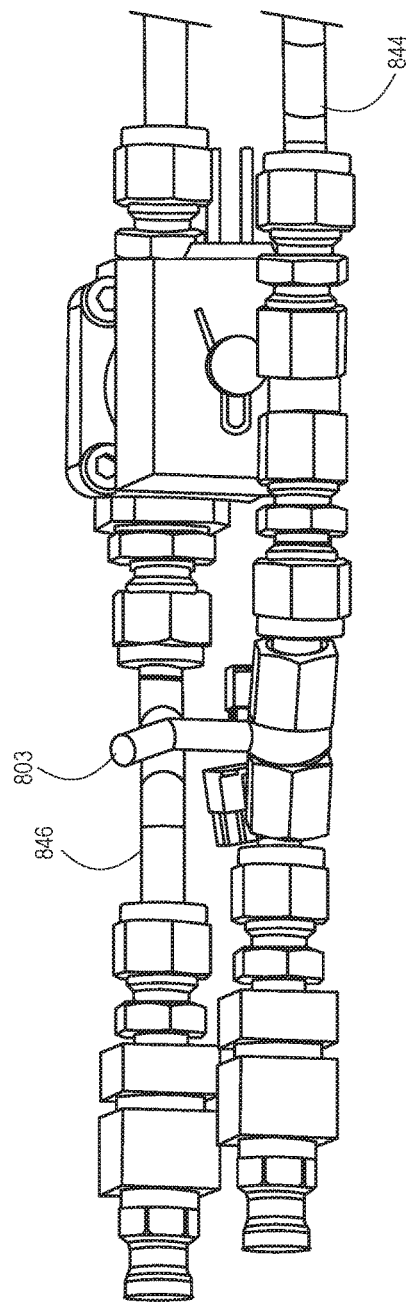
FIG. 11 illustrates a side perspective detail view of a system of conduits of the example LC node of FIG. 8 including a P-trap air-spring reducer conduit, according to one or more embodiments.

FIGS. 9-11 illustrate a system of conduits of the node-level supply conduit 944 and the node-level return conduit 846 of the example LC node 802 (FIG. 8) including a P-trap air-spring reducer conduit 803. FIGS. 12-13 illustrate the dog-leg shape of the P-trap air-spring reducer conduit 803. FIG. 14 illustrates an example air-spring reducer conduit 1403 having an arched, hooked shape.

Figure 15:
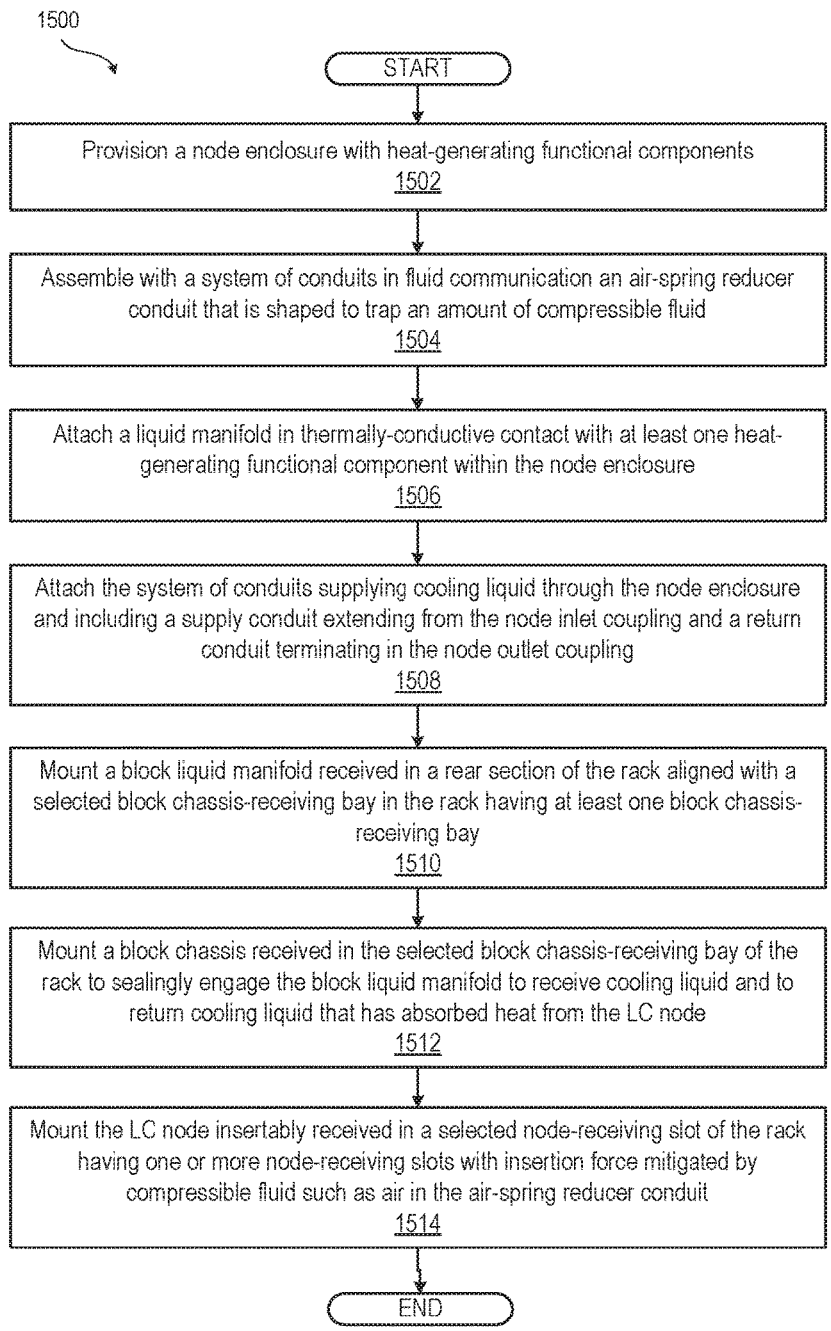
FIG. 15 illustrates a flow diagram of a method of assembling a DL RIHS having an air-spring reducer conduit, according to one or more embodiments.

FIG. 15 illustrates a method 1500 of assembling a DL RIHS that facilitates hot plugging of LC nodes. In one or more embodiments, the method 1500 includes provisioning a node enclosure with heat-generating functional components (block 1502). The method 1500 includes assembling with a system of conduits in fluid communication an air-spring reducer conduit that is shaped to trap an amount of compressible fluid (block 1504). In one embodiment, the air-spring reducer conduit is a P-trap having an arch shape. In one embodiment, the air-spring reducer conduit is hook shaped. In one embodiment, the air-spring reducer conduit is dog-leg shaped.

In one or more embodiments, the method 1500 can include attaching a liquid manifold in thermally-conductive contact with at least one heat-generating functional component within the node enclosure (block 1506). The method 1500 includes attaching the system of conduits supplying cooling liquid through the node enclosure and including a supply conduit extending from the node inlet coupling and a return conduit terminating in the node outlet coupling (block 1508). The node inlet port and the node outlet port are positioned in an outward facing direction at a rear of the node enclosure. The node inlet port and the node outlet port are aligned to releasably seal to the respective inlet liquid port and outlet liquid port in the node-receiving slot, for fluid transfer through the system of conduits to form a LC node. In one or more embodiments, the node inlet and outlet ports can be male quick connect couplings and the node-receiving inlet and the outlet ports can be corresponding female quick connect couplings that engagably seal for fluid transfer and automatically shutoff fluid leak in response to disengagement.

In one or more embodiments, the method 1500 can include mounting a block liquid manifold received in a rear section of the rack aligned with a selected block chassis-receiving bay in the rack having at least one block chassis-receiving bay (block 1510). The method 1500 can include mounting a block chassis received in the selected block chassis-receiving bay of the rack to sealingly engage the block liquid manifold to receive cooling liquid and to return cooling liquid that has absorbed heat from the LC node (block 1512). The block chassis can include one or more node-receiving slots. Each slot has a front opening for node insertion and a rear section opposed to the front access for blind mating of the node inlet and outlet ports to a node-receiving liquid inlet port and a node-receiving liquid outlet port.

The method 1500 includes mounting the LC node insertably received in a selected node-receiving slot of the rack having one or more node-receiving slots with insertion force mitigated by compressible fluid such as air in the air-spring reducer conduit (block 1514). The air compresses during sealing engagement between a node inlet coupling and a node outlet coupling and an inlet liquid port and an outlet liquid port, respectively. The latter are located at the rear section of one node-receiving slot and positioned to be inwardly facing to the LC node inserted in the one node-receiving slot.

In the above described flow charts of FIG. 15, one or more of the methods may be embodied in an automated manufacturing system that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A Rack Information Handling System (RIHS) comprising:
   a rack having one or more node-receiving slots each slot having a front opening for node insertion and a rear section opposed to the front access;
   a node-receiving liquid inlet port and a node-receiving liquid outlet port located at the rear section of one node-receiving slot and positioned to be inwardly facing for blind mating to a node inlet and outlet ports of a liquid-cooled (LC) node inserted in the one node-receiving slot;
   an LC node insertably received in the one node-receiving slot and comprising an air-spring reducer conduit in fluid communication with a system of conduits supplying cooling liquid through a node enclosure, the air-spring reducer shaped to trap an amount of compressible fluid that compresses during sealing engagement between the node inlet coupling and node outlet coupling and the inlet liquid port and outlet liquid port, respectively.

2. The RIHS of claim 1, wherein the system of conduits further comprises a liquid manifold in thermally-conductive contact with at least one heat-generating functional component within the node enclosure.

3. The RIHS of claim 1, wherein:
   the system of conduits comprises a supply conduit extending from a node inlet coupling and a return conduit terminating in a node outlet coupling, the node inlet port and the node outlet port positioned in an outward facing direction at a rear of the node enclosure and aligned to releasably seal to the respective inlet liquid port and outlet liquid port in the node-receiving slot, for fluid transfer through the system of conduits;
   the node inlet and outlet ports comprise male quick connect couplings and the node-receiving inlet and outlet ports comprise corresponding female quick connect couplings that engageably seal for fluid transfer and automatically shut off fluid leak in response to disengagement.

4. The RIHS of claim 1, wherein the air-spring reducer conduit comprises a P trap having an arch that traps the amount of compressive fluid.

5. The RIHS of claim 4, wherein the air-spring reducer conduit comprises first and second conduit segments attached at an oblique angle to each other.

6. The RIHS of claim 4, wherein the air-spring reducer conduit has a hooked shape.

7. The RIHS of claim 1, wherein:
   the rack has at least one block chassis-receiving bay;
   a block liquid manifold is received in a rear section of the rack aligned with a selected block chassis-receiving bay; and
   a block chassis received in the selected block chassis-receiving bay of the rack to receive cooling liquid and to return cooling liquid that has absorbed heat from the LC node, comprising the one or more node-receiving slots, sealing engaged to the block liquid manifold.

8. A liquid cooled (LC) node of a Rack Information Handling System (RIHS) including a rack having one or more node-receiving slots each slot having a front opening for node insertion and a rear section opposed to the front access, the node comprising:
   an air-spring reducer conduit in fluid communication with a system of conduits supplying cooling liquid through the node enclosure, the air-spring reducer conduit shaped to trap an amount of compressible fluid that compresses during sealing engagement between a node inlet coupling and node outlet coupling and an inlet liquid port and outlet liquid port, respectively, positioned to be inwardly facing for blind mating to a node inlet and outlet ports of a liquid-cooled (LC) node inserted in the one node-receiving slot.

9. The LC node of claim 8, wherein the system of conduits further comprises a liquid manifold in thermally-conductive contact with at least one heat-generating functional component within the node enclosure.

10. The LC node of claim 8, wherein:
   the system of conduits comprise a supply conduit extending from a node inlet coupling and a return conduit terminating in a node outlet coupling, the node inlet port and the node outlet port positioned in an outward facing direction at a rear of the node enclosure and aligned to releasably seal to respective inlet liquid port and outlet liquid port in the node-receiving slot for fluid transfer through the system of conduits; and
   the node inlet and outlet ports comprise male quick connect couplings and the node-receiving inlet and the outlet ports comprise corresponding female quick connect couplings that engageably seal for fluid transfer and automatically shutoff fluid leak in response to disengagement.

11. The LC node of claim 8, wherein the air-spring reducer conduit comprises a P trap connected to a liquid manifold in thermally-conductive contact with at least one heat-generating functional component within the node enclosure, the P trap having an arch that traps the amount of compressive fluid.

12. The LC node of claim 11, wherein the air-spring reducer conduit comprises first and second conduit segments attached at an oblique angle to each other.

13. The LC node of claim 11, wherein the air-spring reducer conduit has a hooked shape.

14. The LC node of claim 1, wherein:
the rack has at least one block chassis-receiving bay;
a block liquid manifold is received in a rear section of the rack aligned with a selected block chassis-receiving bay; and
a block chassis received in the selected block chassis-receiving bay of the rack to receive cooling liquid and to return cooling liquid that has absorbed heat from the LC node, comprising the one or more node-receiving slots, sealing engaged to the block liquid manifold.

15. A method of assembling a Rack Information Handling System (RIHS), the method comprising:
provisioning a node enclosure with heat-generating functional components;
assembling a system of conduits in fluid communication with an air-spring reducer conduit that is shaped to trap an amount of compressible fluid that compresses during sealing engagement between a node inlet coupling and a node outlet coupling and an inlet liquid port and an outlet liquid port, respectively; and
mounting the LC node insertably received in the one node-receiving slot of a rack having one or more node-receiving slots each slot having a front opening for node insertion and a rear section opposed to the front access for blind mating of the node inlet and outlet ports to a node-receiving liquid inlet port and a node-receiving liquid outlet port located at the rear section of one node-receiving slot and positioned to be inwardly facing to the LC node inserted in the one node-receiving slot.

16. The method of claim 15, wherein assembling the system of conduits further comprises attaching a liquid manifold in thermally-conductive contact with at least one heat-generating functional component within the node enclosure.

17. The method of claim 15, further comprising:
attaching the system of conduits supplying cooling liquid through the node enclosure and including a supply conduit extending from the node inlet coupling and a return conduit terminating in the node outlet coupling, the node inlet port and the node outlet port positioned in an outward facing direction at a rear of the node enclosure and aligned to releasably seal to the respective inlet liquid port and outlet liquid port in the node-receiving slot, for fluid transfer through the system of conduits to form a liquid-cooled (LC) node;
wherein the node inlet and outlet ports comprise male quick connect couplings and the node-receiving inlet and the outlet ports comprise corresponding female quick connect couplings that engageably seal for fluid transfer and automatically shutoff fluid leak in response to disengagement.

18. The method of claim 15, wherein the air-spring reducer conduit comprises a P trap connected to a liquid manifold in thermally-conductive contact with at least one heat-generating functional component within the node enclosure, the P trap having an arch that traps the amount of compressive fluid.

19. The method of claim 18, wherein the air-spring reducer conduit comprises a selected one of a hooked shape and a dog-leg shape having a first and second conduit segments attached at an oblique angle to each other.

20. The method of claim 15, further comprising:
mounting a block liquid manifold received in a rear section of the rack aligned with a selected block chassis-receiving bay in the rack having at least one block chassis-receiving bay; and
mounting a block chassis received in the selected block chassis-receiving bay of the rack to receive cooling liquid and to return cooling liquid that has absorbed heat from the LC node, wherein the block chassis comprises the one or more node-receiving slots, wherein the block chassis sealingly engages to the block liquid manifold.

* * * * *